US012751316B2

(12) United States Patent
Shih et al.

(10) Patent No.: US 12,751,316 B2
(45) Date of Patent: Sep. 29, 2026

(54) MICROELECTRONIC DEVICE

(71) Applicant: VisEra Technologies Company Ltd., Hsin-Chu City (TW)

(72) Inventors: Wen-Yu Shih, Hsin-Chu City (TW); Chin-Ching Chang, Hsin-Chu City (TW); Yi-Hua Chiu, Hsin-Chu City (TW)

(73) Assignee: VisEra Technologies Company Ltd., Hsin-Chu City (TW)

( * ) Notice: Subject to any disclaimer, the term of this patent is extended or adjusted under 35 U.S.C. 154(b) by 308 days.

(21) Appl. No.: 18/754,880

(22) Filed: Jun. 26, 2024

(65) Prior Publication Data

US 2026/0005089 A1 Jan. 1, 2026

(51) Int. Cl.

| | |
|---|---|
| ***H10W 74/10*** | (2026.01) |
| ***H10F 77/30*** | (2025.01) |
| ***H10F 77/40*** | (2025.01) |
| ***H10W 74/47*** | (2026.01) |

(52) U.S. Cl.

CPC ........ *H10W 74/121* (2026.01); *H10F 77/331* (2025.01); *H10F 77/413* (2025.01); *H10W 74/114* (2026.01); *H10W 74/127* (2026.01); *H10W 74/47* (2026.01)

(58) Field of Classification Search

CPC ............. H10W 74/121; H10W 74/114; H10W 74/127; H10W 74/47; H10F 77/331; H10F 77/413; H10F 77/50

USPC .......................................................... 257/787

See application file for complete search history.

(56) References Cited

U.S. PATENT DOCUMENTS

| | | | | |
|---|---|---|---|---|
| 11,164,900 B2 * | 11/2021 | Fan | ........................ | H10F 39/011 |
| 2021/0028210 A1 * | 1/2021 | Okamoto | ............... | G02B 7/028 |
| 2023/0129129 A1 * | 4/2023 | Oh | ........................ | H10F 39/804 257/419 |
| 2024/0170510 A1 * | 5/2024 | Song | ..................... | H10F 39/011 |

FOREIGN PATENT DOCUMENTS

| | | | |
|---|---|---|---|
| TW | 202226587 | A | 7/2022 |
| TW | 202249270 | A | 12/2022 |
| TW | 202406128 | A | 2/2024 |
| TW | 202417886 | A | 5/2024 |

* cited by examiner

*Primary Examiner* — Mohammad M Hoque

(74) *Attorney, Agent, or Firm* — MUNCY, GEISSLER, OLDS & LOWE, P.C.

(57) ABSTRACT

An microelectronic device includes a semiconductor substrate, at least one sensing element disposed in the semiconductor substrate, at least one multi-film stack disposed on the semiconductor substrate and covering the sensing element, a refill layer disposed on the semiconductor substrate and encircling the multi-film stack, and a spacer layer disposed on the multi-film stack and the refill layer. An area of a top surface of the multi-film stack is less than an area of a bottom surface of the multi-film stack. The multi-film stack has a first dimension measured in a direction, a section of the refill layer has a second dimension measured in the direction, and a ratio of the second dimension to the first dimension is in a range from 0.03 to 0.06. The refill layer and the spacer layer are organic layers.

20 Claims, 16 Drawing Sheets

MICROELECTRONIC DEVICE

BACKGROUND

Field of Invention

The present disclosure relates to a microelectronic device.

Description of Related Art

In the field of microelectronic devices, such as light sensor, time-of-flight (TOF) detector, spectrometer, or the like, inorganic multilayer film is widely used in order to substantially optimize optical performance of the microelectronic device. For example, the inorganic multilayer film can be disposed over photosensitive elements to change the characteristic and/or the light path of an external light. However, layers disposed above the sensing elements may cause a stress imbalance between the layers due to the dissimilar nature of constituents of the layers, such situation would lead to unwanted wafer bending or peeling issue. Therefore, there is a need to solve the above problems.

SUMMARY

An aspect of the disclosure provides a microelectronic device. The microelectronic device includes a semiconductor substrate, at least one sensing element disposed in the semiconductor substrate, at least one multi-film stack disposed on the semiconductor substrate and covering the sensing element, a refill layer disposed on the semiconductor substrate and encircling the multi-film stack, and a spacer layer disposed on the multi-film stack and the refill layer. An area of a top surface of the multi-film stack is less than an area of a bottom surface of the multi-film stack. The multi-film stack has a first dimension measured in a direction, a section of the refill layer has a second dimension measured in the direction, and a ratio of the second dimension to the first dimension is in a range from 0.03 to 0.06. The refill layer and the spacer layer are organic layers.

In some embodiments, the sensing element is a photodiode, and the multi-film stack is a waveband filter.

In some embodiments, a thickness of the refill layer is in a range from 0.5 μm to 10 μm.

In some embodiments, a ratio of the area of the top surface of the multi-film stack to an area of a top surface of the semiconductor substrate is less than 90%.

In some embodiments, the second dimension is measured at a bottom surface of the section of the refill layer.

In some embodiments, an area of a top surface of the refill layer is greater than an area of a bottom surface of the refill layer, a third dimension is measured at the top surface of the section of the refill layer, and a ratio of the third dimension to the first dimension is in a range from 0.035 to 0.065.

In some embodiments, a thickness of the spacer layer is in a range from 0.5 μm to 300 μm.

In some embodiments, the multi-film stack is an inorganic material, an elastic modulus of the multi-film stack is in a range from 60 GPa to 230 GPa.

In some embodiments, an elastic modulus of the refill layer is in a range from 1 GPa to 45 GPa.

In some embodiments, an elastic modulus of the spacer layer is in a range from 1 GPa to 45 GPa.

In some embodiments, a coefficient of thermal expansion of the multi-film stack is less than 10 ppm.

In some embodiments, a coefficient of thermal expansion of the refill layer is in a range from 250 ppm to 550 ppm.

In some embodiments, a coefficient of thermal expansion of the spacer layer is 20 ppm to 330 ppm.

In some embodiments, a material of the multi-film stack includes dielectric, transparent conductive oxide, or metallic material.

In some embodiments, the refill layer includes at least one material selected from a group consisting of flourene oligomer, bisphenol A ethoxylate diacrylate, propylene glycol monomethyl ether, and propylene glycol monomethylether acetate.

In some embodiments, the spacer layer includes at least one material selected from a group consisting of flourene oligomer, bisphenol A ethoxylate diacrylate, propylene glycol monomethyl ether, and propylene glycol monomethylether acetate.

In some embodiments, a number of the at least one sensing element is plural, a number of the at least one multi-film stack is plural, and the refill layer encircles the multi-film stacks.

In some embodiments, the microelectronic device further includes a micro-lens layer disposed on the spacer layer, wherein the micro-lens layer covers the multi-film stack.

In some embodiments, the microelectronic device further includes a micro-lens layer disposed on the spacer layer, wherein the micro-lens layer covers the multi-film stack and the refill layer.

In some embodiments, the microelectronic device further includes an adhesion layer disposed between the refill layer and the semiconductor substrate.

The refill layer and the spacer layer of the microelectronic device are organic layers such that the stress between the interface of the refill layer and the spacer layer can be reduced and more balance. The ratio of the second dimension of the section of the refill layer to the first dimension of the multi-film stack is in a range from 0.03 to 0.06, to provide better binding ability between the multi-film stack, the refill layer, and the spacer layer.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
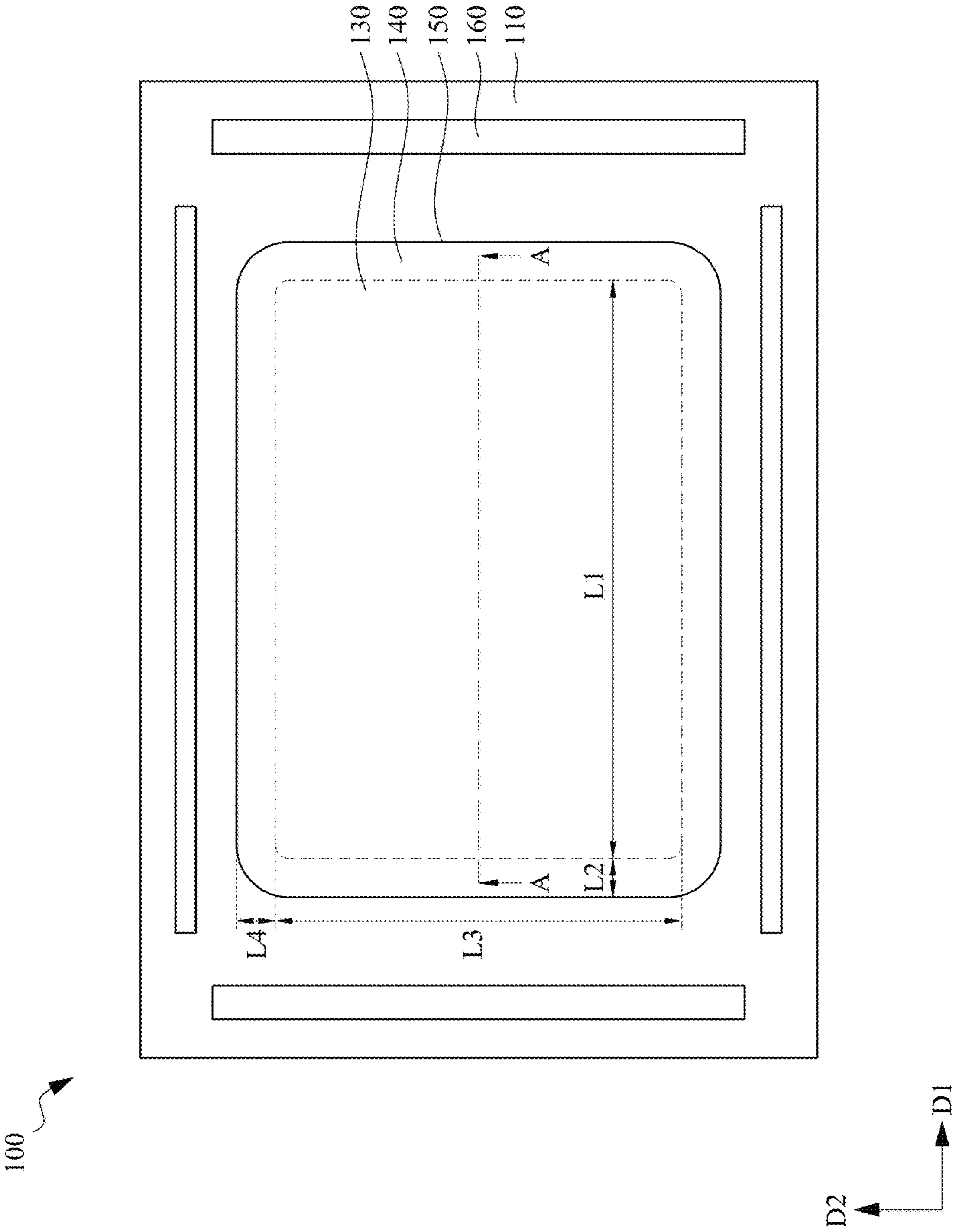
FIG. 1 is a top view of a microelectronic device according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
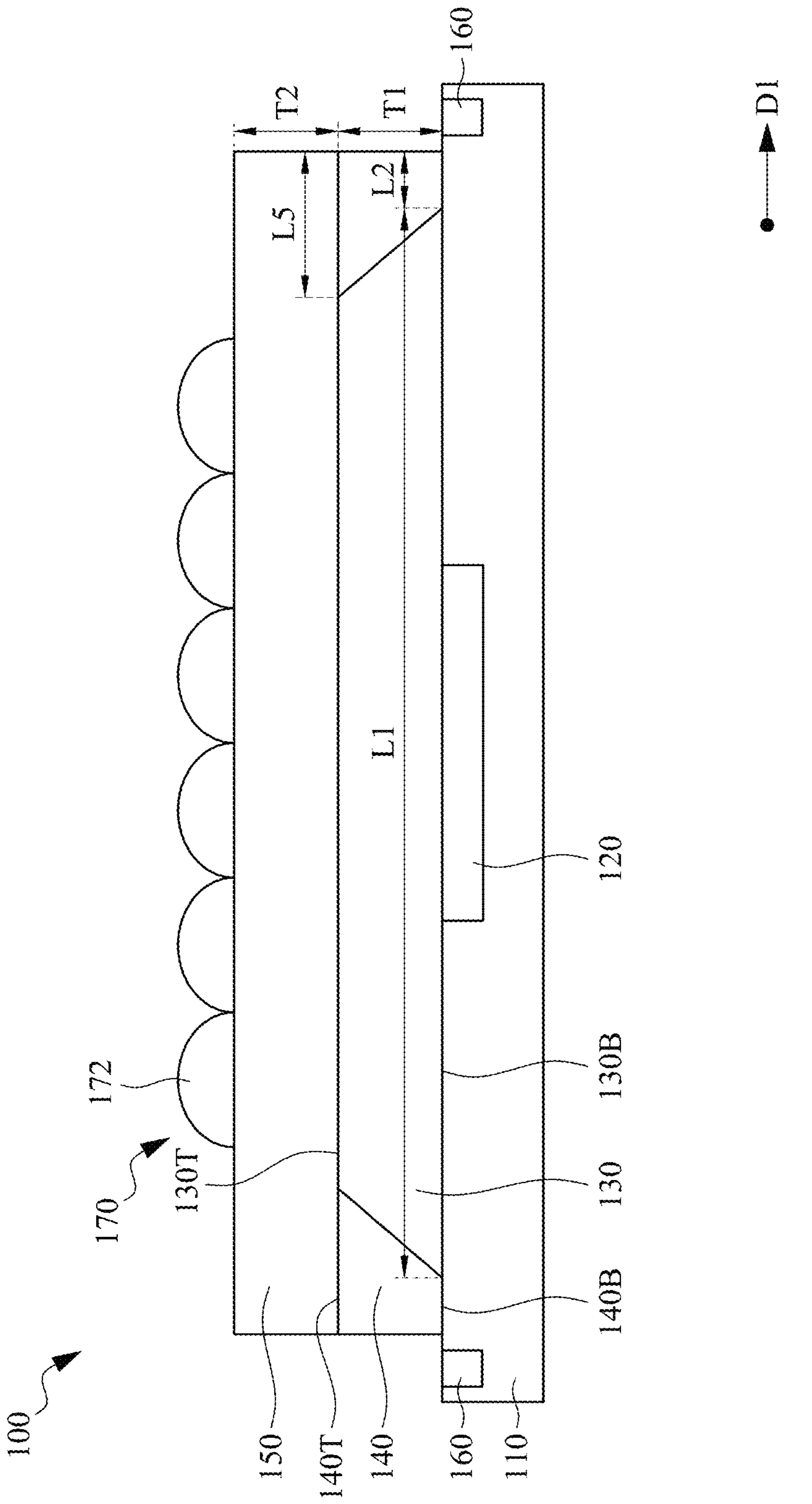
FIG. 2 is a cross-sectional view of a microelectronic device according to some embodiments of the disclosure.

Reference is made to both FIG. 1 and FIG. 2, in which FIG. 1 is a top view of a microelectronic device according to some embodiments of the disclosure, and FIG. 2 is a cross-sectional view of a microelectronic device according to some embodiments of the disclosure, in which the cross-sectional view is taken along line A-A in FIG. 1. The microelectronic device 100 includes a semiconductor substrate 110, at least one sensing element 120 disposed in the semiconductor substrate 110, at least one multi-film stack 130 disposed on the semiconductor substrate 110 and covering the sensing element 120, a refill layer 140 disposed on the semiconductor substrate 110 and encircling the multi-film stack 130, and a spacer layer 150 disposed on the multi-film stack 130 and the refill layer 140. The refill layer 140 and the spacer layer 150 are organic layers such that the stress between the interface of the refill layer 140 and the spacer layer 150 can be reduced and more balance.

The area of a top surface 130T of the multi-film stack 130 is less than an area of a bottom surface 130B of the multi-film stack 130. In some embodiments, the multi-film stack 130 has a trapezoid shape cross-section, and the top surface 130T of the multi-film stack 130 is a flat surface. The area of a top surface 140T of the refill layer 140 is greater than an area of a bottom surface 140B of the refill layer 140. In some embodiments, the refill layer 140 has a trapezoid shape cross-section, and the top surface 140T of the refill layer 140 is a flat surface. In some embodiments, the top surface 130T of the multi-film stack 130 and the top surface 140T of the refill layer 140 are coplanar.

The microelectronic device 100 further limits the dimensions of the multi-film stack 130 and the refill layer 140 to provide better binding ability between the multi-film stack 130, the refill layer 140, and the spacer layer 150.

For example, the multi-film stack 130 has a first dimension L1 measured in a first direction D1, and a section of the refill layer 140 has a second dimension L2 measured in the first direction D1, and a ratio of the second dimension L2 to the first dimension L1 is in a range from 0.03 to 0.06. The multi-film stack 130 has a third dimension L3 measured in a second direction D2, and a section of the refill layer 140 has a fourth dimension L4 measured in the second direction D2, and a ratio of the fourth dimension L4 to the third dimension L3 is in a range from 0.03 to 0.06. In some embodiments, the ratio of the second dimension L2 to the first dimension L1 can be same as or different from the ratio of the fourth dimension L4 to the third dimension L3.

If the ratio of the dimension of the refill layer 140 to the dimension of the multi-film stack 130 such as L2/L1 or L4/L3 is smaller than 0.03, the protection ability and the binding ability of the refill layer 140 is insufficient, and the multi-film stack 130 may be exposed to external factors such as water, humidity, or UV, thereby reducing the performance of the microelectronic device 100. If the ratio of the dimension of the refill layer 140 to the dimension of the multi-film stack 130 such as L2/L1 or L4/L3 is greater than 0.06, that means the refill layer 140 is too long so that the stress between the refill layer 140 and the spacer layer 150 is getting greater.

In some embodiments, the dimension of the multi-film stack 130 such as the first dimension L1 or the third dimension L3 is measured at the bottom surface 130B of the multi-film stack 130. In some embodiments, the dimension of the refill layer 140 such as the second dimension L2 or the fourth dimension L4 is measured at the bottom surface 140B of the section of the refill layer 140.

In some embodiments, the microelectronic device 100 can be a light sensor, a time-of-flight (TOF) detector, a spectrometer, or the like. In some embodiments, the sensing element 120 includes one or more photodiodes, and the multi-film stack 130 is a waveband filter.

In some embodiments, a ratio of the area of the top surface 130T of the multi-film stack 130 to the area of the top surface 110T of the semiconductor substrate 110 is less than 90%. In some embodiments, the microelectronic device 100 further includes a plurality of pads 160 disposed in the semiconductor substrate 110 to electrically connect to the sensing element 120. In some embodiments, the pads 160 are not covered by the multi-film stack 130 or the refill layer 140, and the pads 160 are disposed surrounding the sensing element 120.

The material of the multi-film stack 130 is an inorganic material. In some embodiments, the material of the multi-film stack 130 includes dielectric, transparent conductive oxide, or metallic material. The elastic modulus of the multi-film stack 130 is greater than 60 Gpa. In some embodiments, the elastic modulus of the multi-film stack 130 is in a range from 60 GPa to 230 GPa. In some embodiments, the elastic modulus of the multi-film stack 130 is in a range from 70 GPa to 215 GPa. The coefficient of thermal expansion of the multi-film stack 130 is less than 10 ppm. In some embodiments, the coefficient of thermal expansion of the multi-film stack 130 is in a range from 0.65 ppm to 9 ppm.

The material of the refill layer 140 is an organic material. In some embodiments, the material of the refill layer 140 includes at least one material selected from a group consisting of flourene oligomer, bisphenol A ethoxylate diacrylate, propylene glycol monomethyl ether, and propylene glycol monomethylether acetate.

The elastic modulus of the refill layer 140 is less than 50 Gpa. In some embodiments, the elastic modulus of the refill layer 140 is in a range from 1 GPa to 45 GPa. In some embodiments, the elastic modulus of the refill layer 140 is in a range from 2 GPa to 40 GPa. The coefficient of thermal expansion of the refill layer 140 is less than 600 ppm. In some embodiments, the coefficient of thermal expansion of the refill layer 140 is in a range from 250 ppm to 550 ppm. In some embodiments, the coefficient of thermal expansion of the refill layer 140 is in a range from 300 ppm to 500 ppm.

In some embodiments, the thickness T1 of the refill layer 140 is in a range from 0.5 μm to 10 μm. The dimension measured at the top surface 140T of the refill layer 140 is greater than dimension measured at the bottom surface 140B of the refill layer 140. In some embodiments, a fifth dimension L5 is measured at the top surface 140T of the refill layer 140 in the first direction, and a ratio of the fifth dimension L5 of the refill layer 140 to the first dimension L1 of the multi-film stack 130 is in a range from 0.035 to 0.065.

The material of the spacer layer 150 is an organic material. In some embodiments, the material of the spacer layer 150 includes at least one material selected from a group consisting of flourene oligomer, bisphenol A ethoxylate diacrylate, propylene glycol monomethyl ether, and propylene glycol monomethylether acetate. The material of the spacer layer 150 can be same as or different from the material of the refill layer 140.

The elastic modulus of the spacer layer 150 is less than 50 Gpa. In some embodiments, the elastic modulus of the spacer layer 150 is in a range from 1 GPa to 45 GPa. In some embodiments, the elastic modulus of the spacer layer 150 is in a range from 2 GPa to 40 GPa. The coefficient of thermal expansion of the spacer layer 150 is less than 350 ppm. In some embodiments, the coefficient of thermal expansion of the spacer layer 150 is in a range from 20 ppm to 330 ppm. In some embodiments, the coefficient of thermal expansion of the spacer layer 150 is in a range from 30 ppm to 300 ppm. In some embodiments, the thickness T2 of the spacer layer 150 is in a range from 0.5 μm to 300 μm.

In some embodiments, the microelectronic device 100 further includes a micro-lens layer 170 disposed on the spacer layer 150. The micro-lens layer 170 includes a plurality of micro-lenses 172, in which at least one of the micro-lenses 172 directly covers the sensing element 120, and at least one of the micro-lenses 172 does not directly cover the sensing element 120. In some embodiments, the micro-lens layer 170 is disposed only on the multi-film stack 130 and is not disposed on the refill layer 140.

Figure 3:
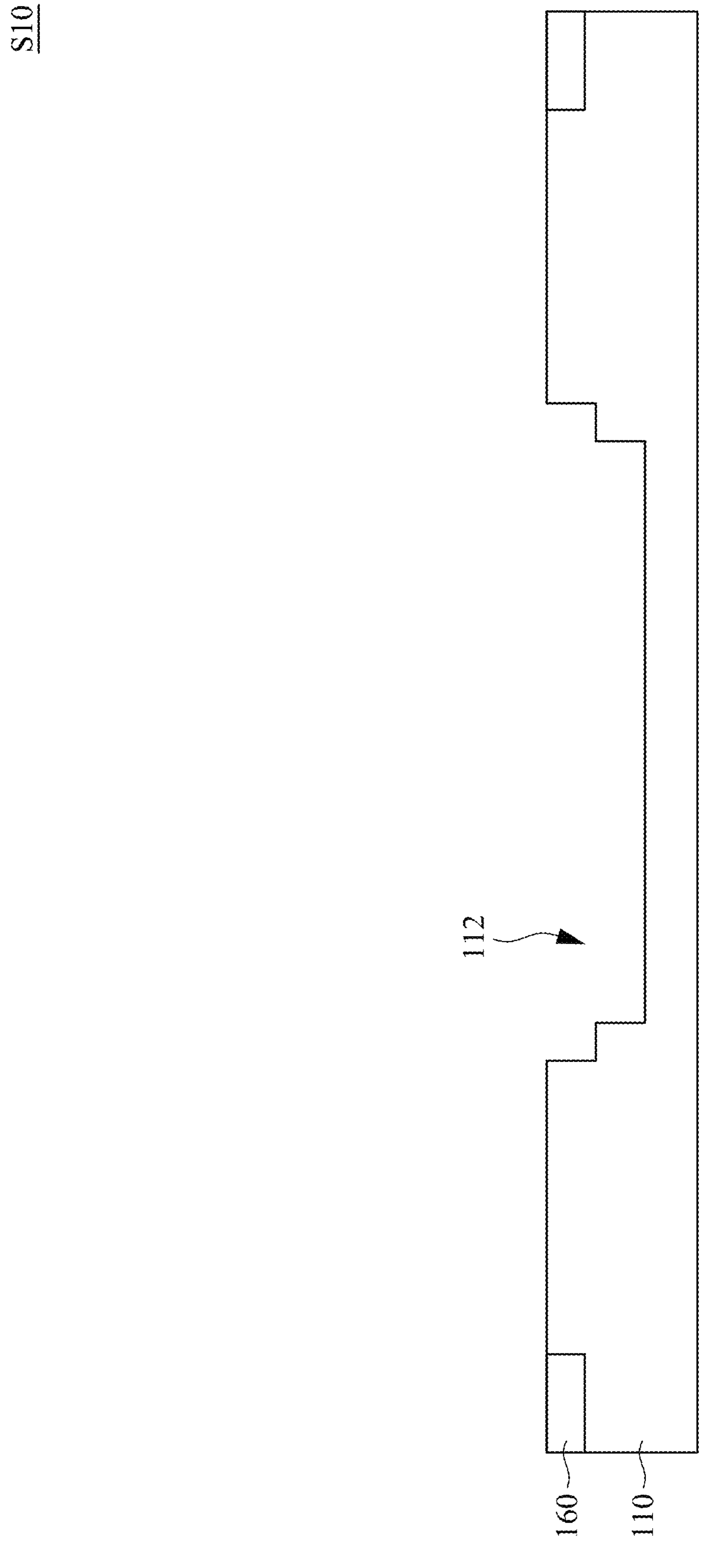
FIG. 3 to FIG. 13 are cross-sectional views of different stages of a method of manufacturing a microelectronic device according to some embodiments of the disclosure.

Reference is made to FIG. 3 to FIG. 13, which are cross-sectional views of different stages of a method of manufacturing a microelectronic device according to some embodiments of the disclosure. As shown in FIG. 3, the method of manufacturing the microelectronic device begins at step S10. A plurality of pads 160 are formed on a semiconductor substrate 110, and a cavity 112 is formed in the semiconductor substrate 110. In some embodiments, the cavity 112 is surrounded by the pads 160. In some embodiments, the cavity 112 includes at least one depth and may have a step cross-section.

Figure 4:
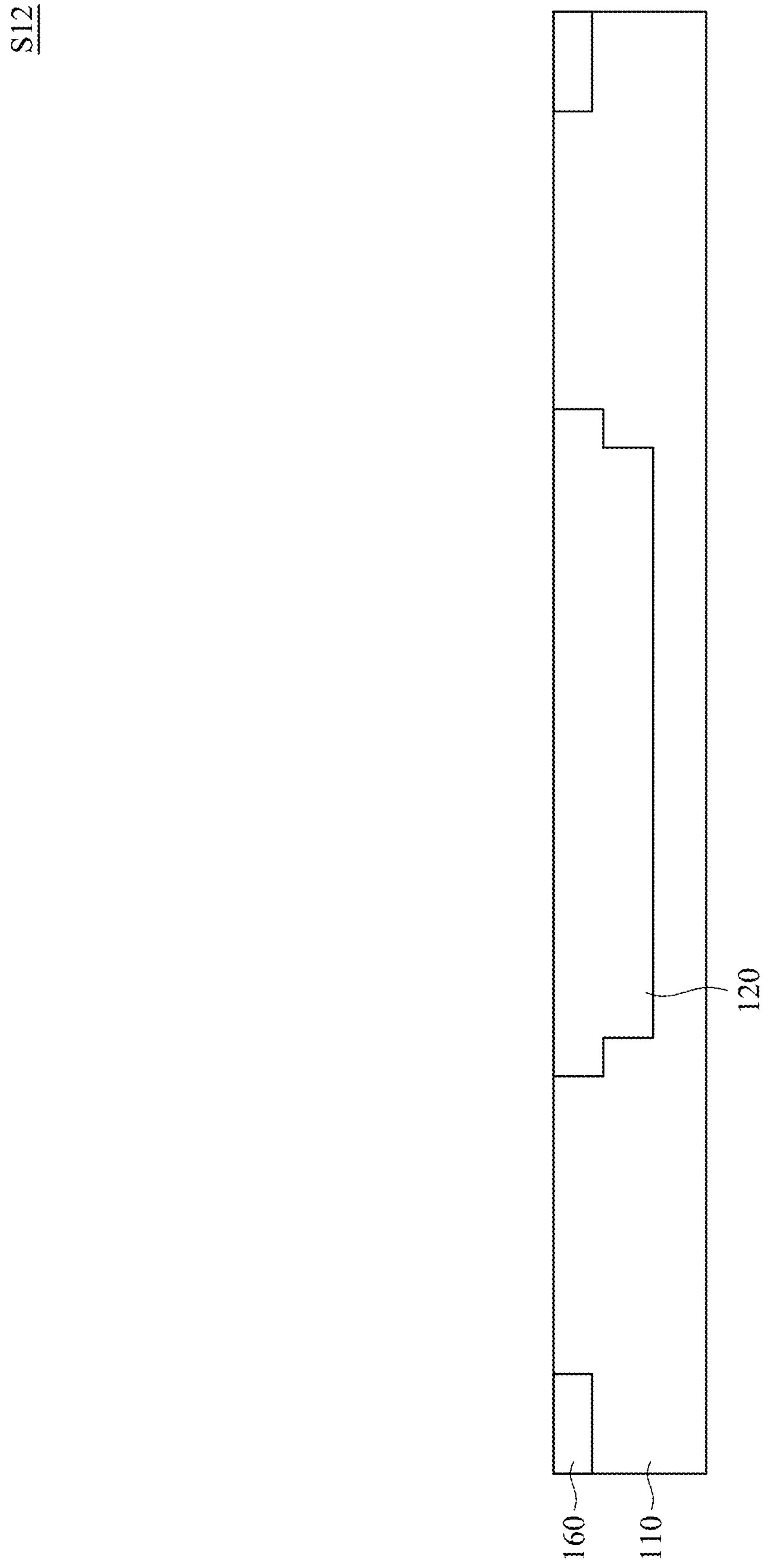

Referring to FIG. 4, the method of manufacturing the microelectronic device goes to step S12. A photosensitive material if deposited in the cavity 112 to form a sensing element 120 in the semiconductor substrate 110. In some embodiments, the photosensitive material is a semiconductor material having P-N junction. In some embodiments, the sensing element 120 includes one or more photodiodes.

Figure 5:
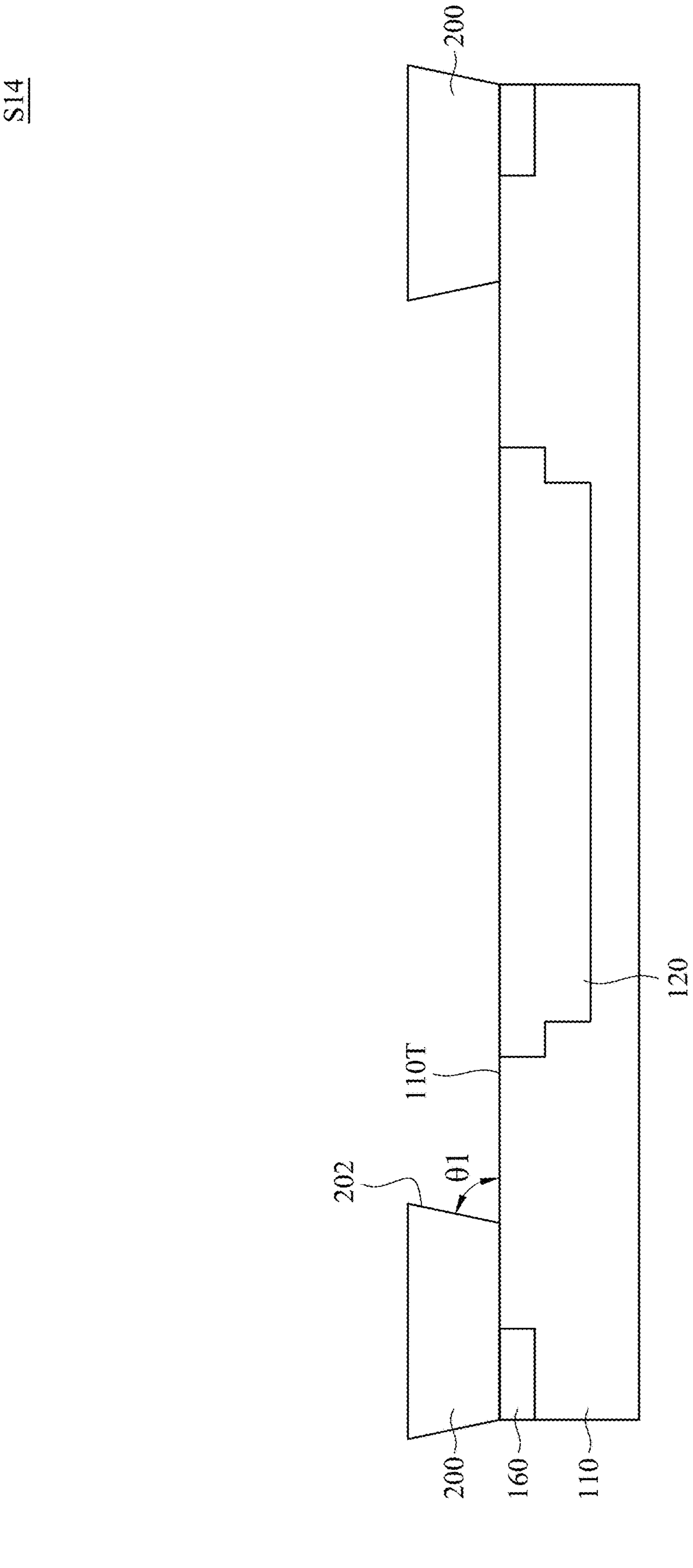

Referring to FIG. 5, the method of manufacturing the microelectronic device goes to step S14. A first photoresist layer 200 is disposed on the semiconductor substrate 110 to define a sensing area a peripheral area. In some embodiments, the first photoresist layer 200 covers the peripheral area of the semiconductor substrate 110 and covers the pads 160.

In some embodiments, the first photoresist layer 200 has an obtuse angle θ1 between an inclined sidewall 202 of the first photoresist layer 200 and a top surface 110T of the semiconductor substrate 110 so that the inclined sidewall 202 faces toward the top surface 110T of the semiconductor substrate 110. The obtuse angle θ1 is greater than 90 degrees. In some embodiment, a material of the first photoresist layer 200 may be a positive-type photoresist or a negative-type photoresist. In some embodiment, the pattern of the first photoresist layer 200 may be formed by a lithography process. The inclined sidewall 202 may be formed by adjusting the focus of photolithography, but not limited thereto.

Figure 6:
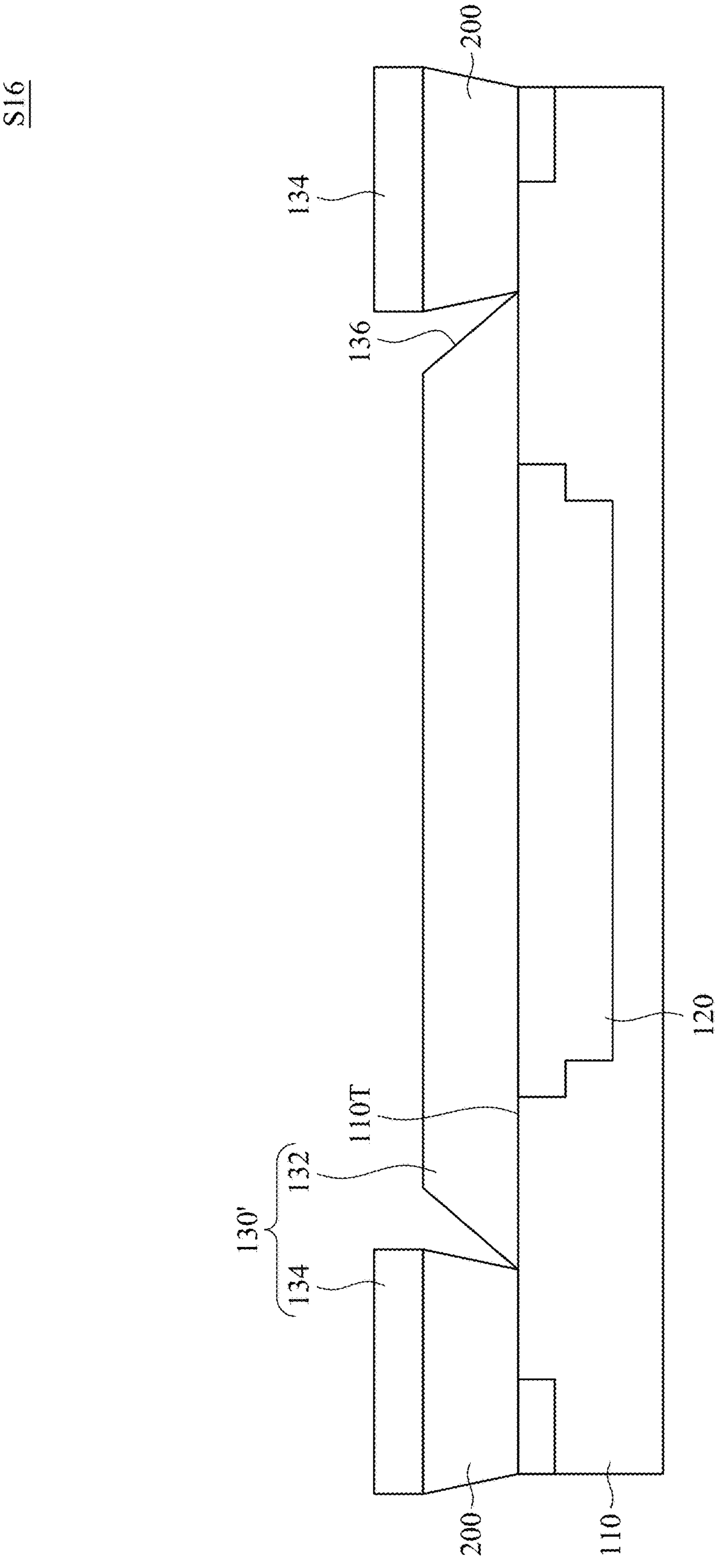

Referring to FIG. 6, the method of manufacturing the microelectronic device goes to step S16. A multi-film layer 130' is formed on the semiconductor substrate 110. Specifically, the multi-film layer 130' includes a first portion 132 and a second portion 134. The first portion 132 of the multi-film layer 130' is disposed on the top surface 110T of the semiconductor substrate 110. The second portion 134 of the multi-film layer 130' is disposed on the first photoresist layer 200. In some embodiments, the first portion 132 of the multi-film layer 130' also has an inclined sidewall 136 because of the shape of the first photoresist layer 200.

The multi-film layer 130' includes multiple films, and each film may be formed by PVD or other suitable deposition process. In some embodiments, a material of the multi-film layer 130' includes dielectric, transparent conductive oxide, or metallic material. In some embodiments, a material of the multi-film layer 130' includes a-Si, $SiO_2$, SiN, $Nb_2O_5$, $GeO_2$, $TiO_2$, etc.

Figure 7:
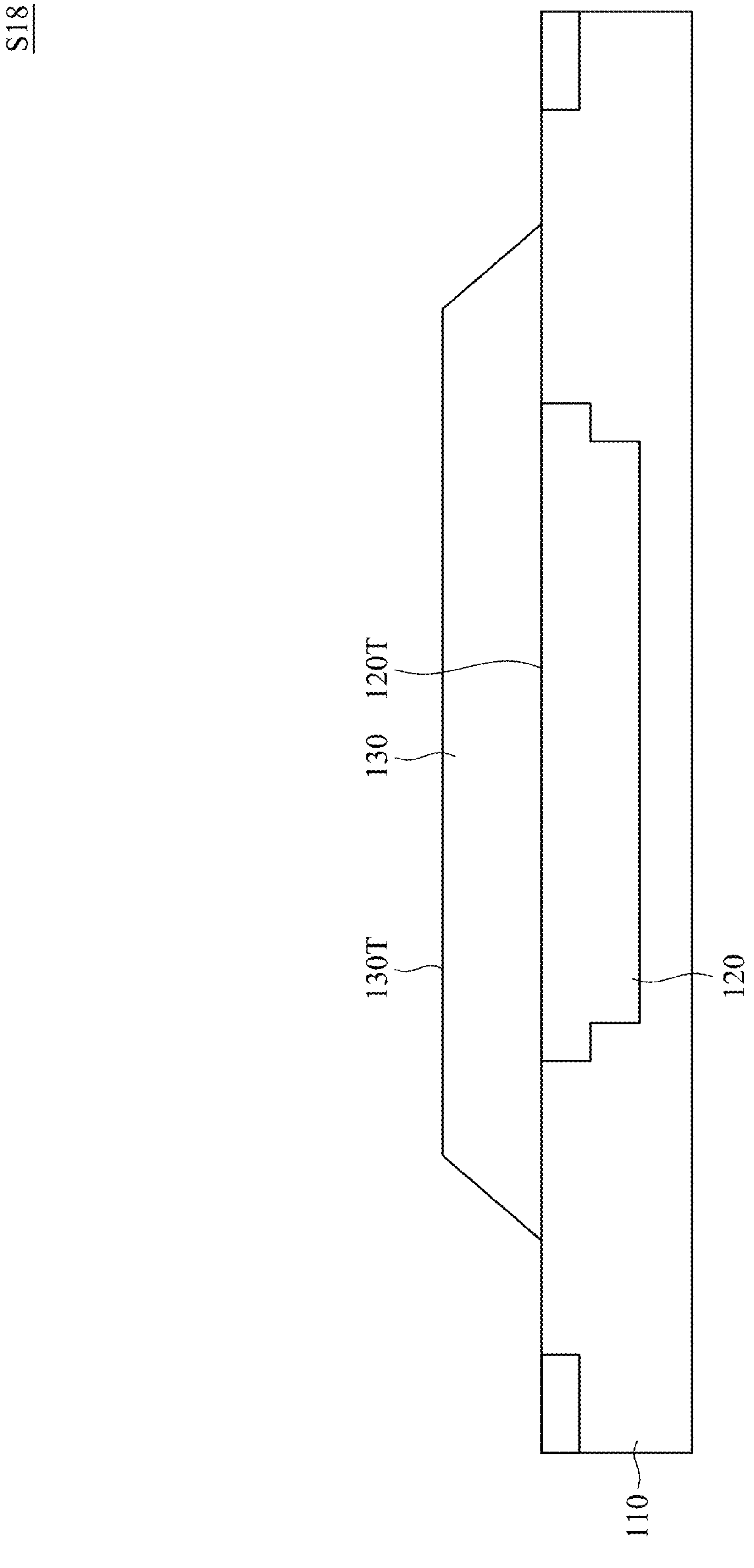

Referring to FIG. 7, the method of manufacturing the microelectronic device goes to step S18. The first photoresist layer 200 and the second portion 134 of the multi-film layer 130' are removed by a lift-off process. As a result, the remaining first portion 132 of the multi-film layer 130' is the multi-film stack 130 on the sensing element 120. The multi-film stack 130 covers the sensing element 120, and the top surface 120T of the sensing element 120 is entirely contained in the projection of the top surface 130T of the multi-film stack 130 on the semiconductor substrate 110.

Figure 8:
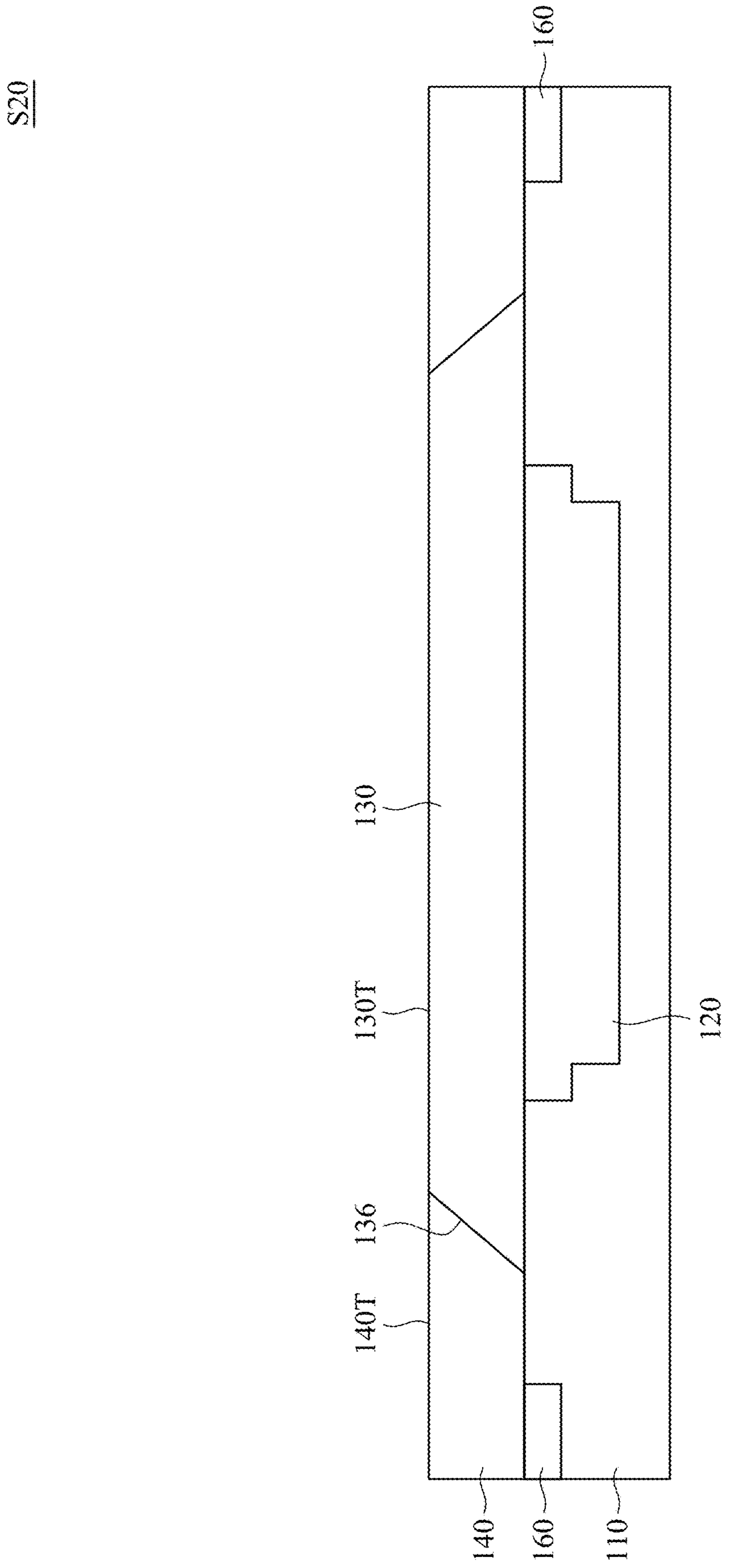

Referring to FIG. 8, the method of manufacturing the microelectronic device goes to step S20. A refill layer 140 is deposited on the peripheral area of the semiconductor substrate 110. The material of the refill layer 140 is an organic material. In some embodiments, the material of the refill layer 140 includes at least one material selected from a group consisting of flourene oligomer, bisphenol A ethoxylate diacrylate, propylene glycol monomethyl ether, and propylene glycol monomethylether acetate. The refill layer 140 encircles the multi-film stack 130 and is directly in contact with the inclined sidewall 136 of the multi-film stack 130. The refill layer 140 also covers the pads 160 at the peripheral area of the semiconductor substrate 110. In some embodiments, a planarization process can be performed such that the top surface 130T of the multi-film stack 130 and the top surface 140T of the refill layer 140 are coplanar.

Figure 9:
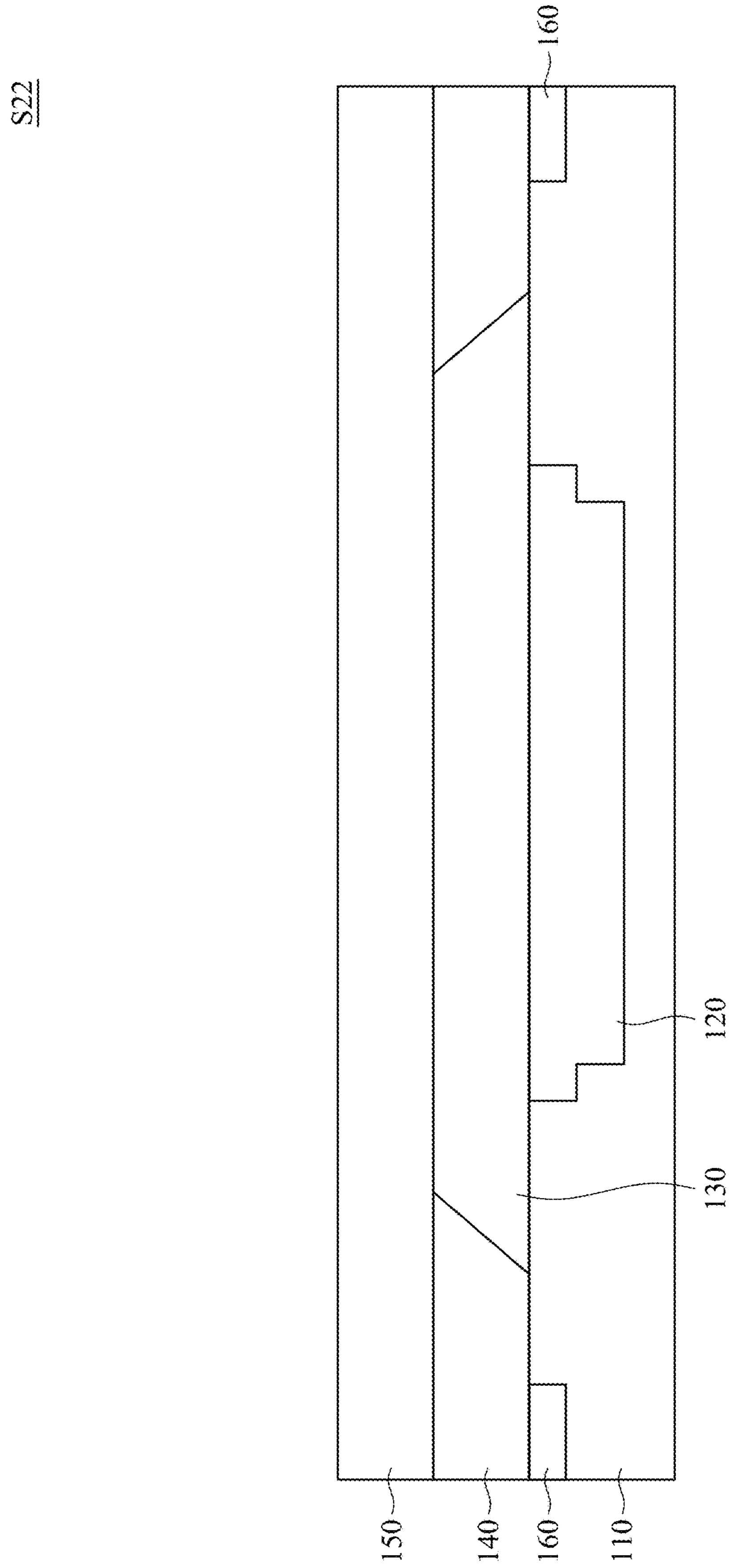

Referring to FIG. 9, the method of manufacturing the microelectronic device goes to step S22. A spacer layer 150 is deposited on the multi-film stack 130 and the refill layer 140. The material of the spacer layer 150 is an organic material. In some embodiments, the material of the spacer layer 150 includes at least one material selected from a group consisting of flourene oligomer, bisphenol A ethoxylate diacrylate, propylene glycol monomethyl ether, and propylene glycol monomethylether acetate.

Figure 10:
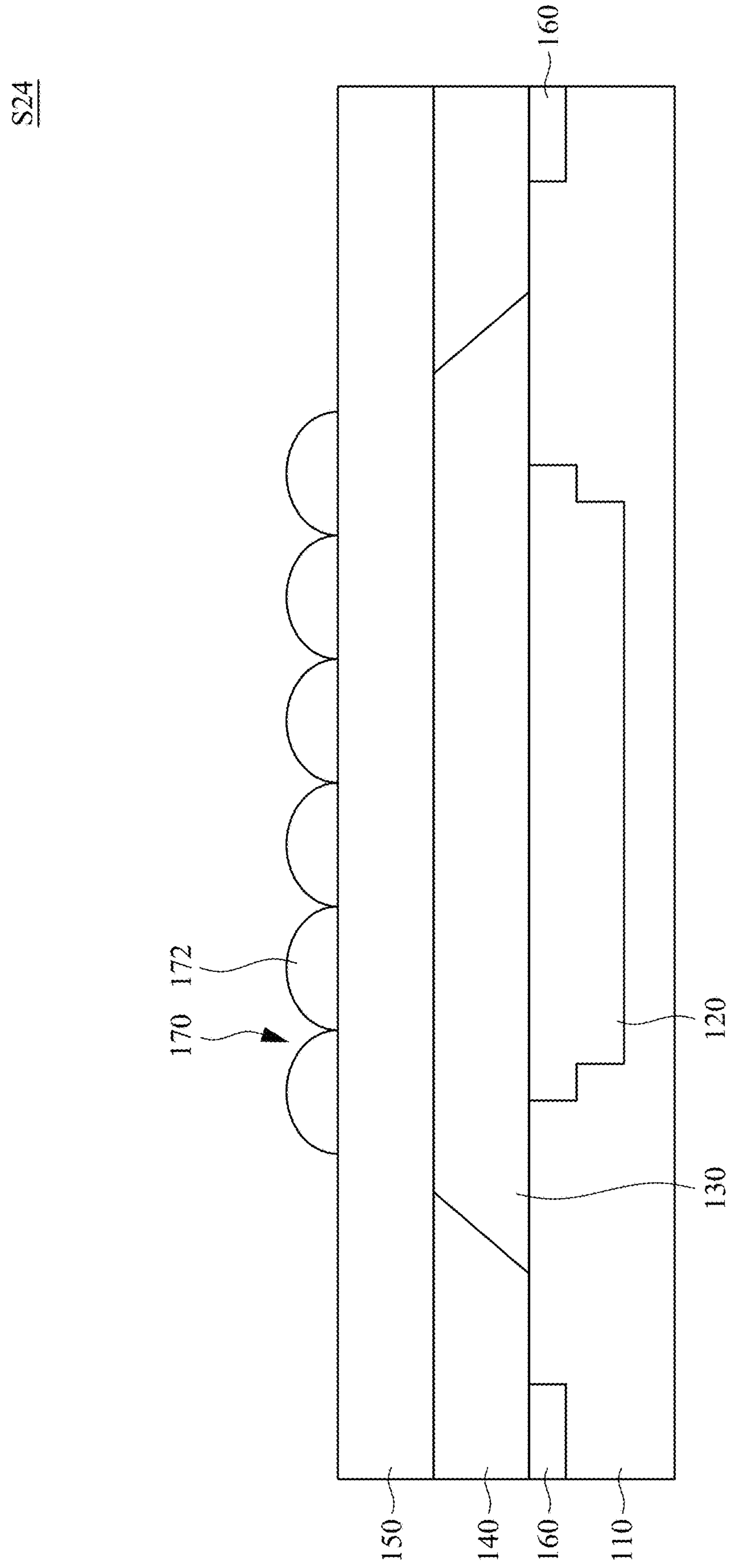

Referring to FIG. 10, the method of manufacturing the microelectronic device goes to step S24. A micro-lens layer 170 is formed on the spacer layer 150. The micro-lens layer 170 includes a plurality of micro-lenses 172 on the sensing element 120. In some embodiments, the sensing element 120 is corresponded to multiple micro-lens layer 170 disposed on the spacer layer 150. The micro-lens layer 170 includes a plurality of micro-lenses 172. In some embodiments, the micro-lens layer 170 is disposed only on the multi-film stack 130 and is not disposed on the refill layer 140.

Figure 11:
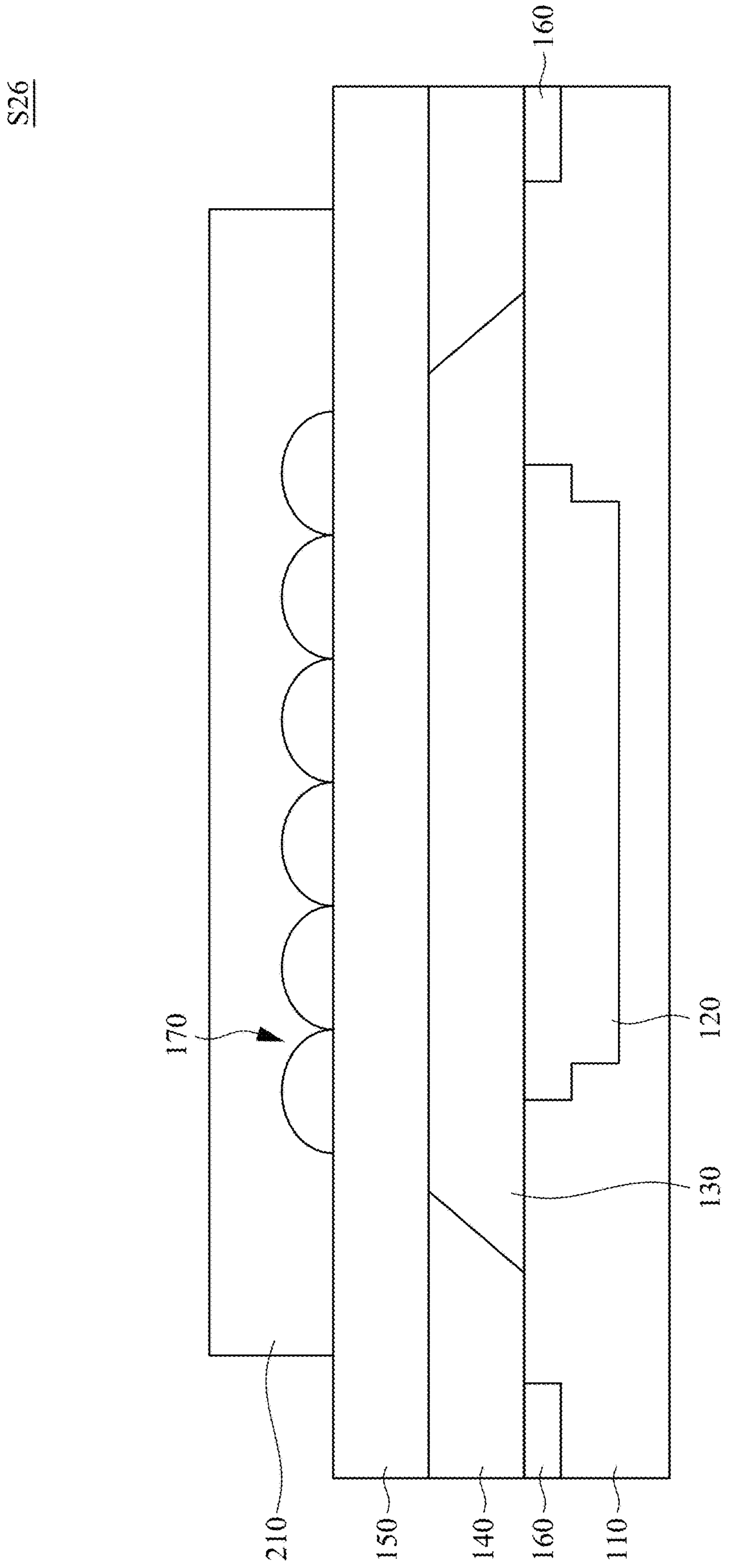

Referring to FIG. 11, the method of manufacturing the microelectronic device goes to step S26. A second photoresist layer 210 is formed on the spacer layer 150. The second photoresist layer 210 covers entire of the micro-lens layer 170 and the multi-film stack 130, and a portion of the refill layer 140. The second photoresist layer 210 does not cover the pads 160.

Figure 12:
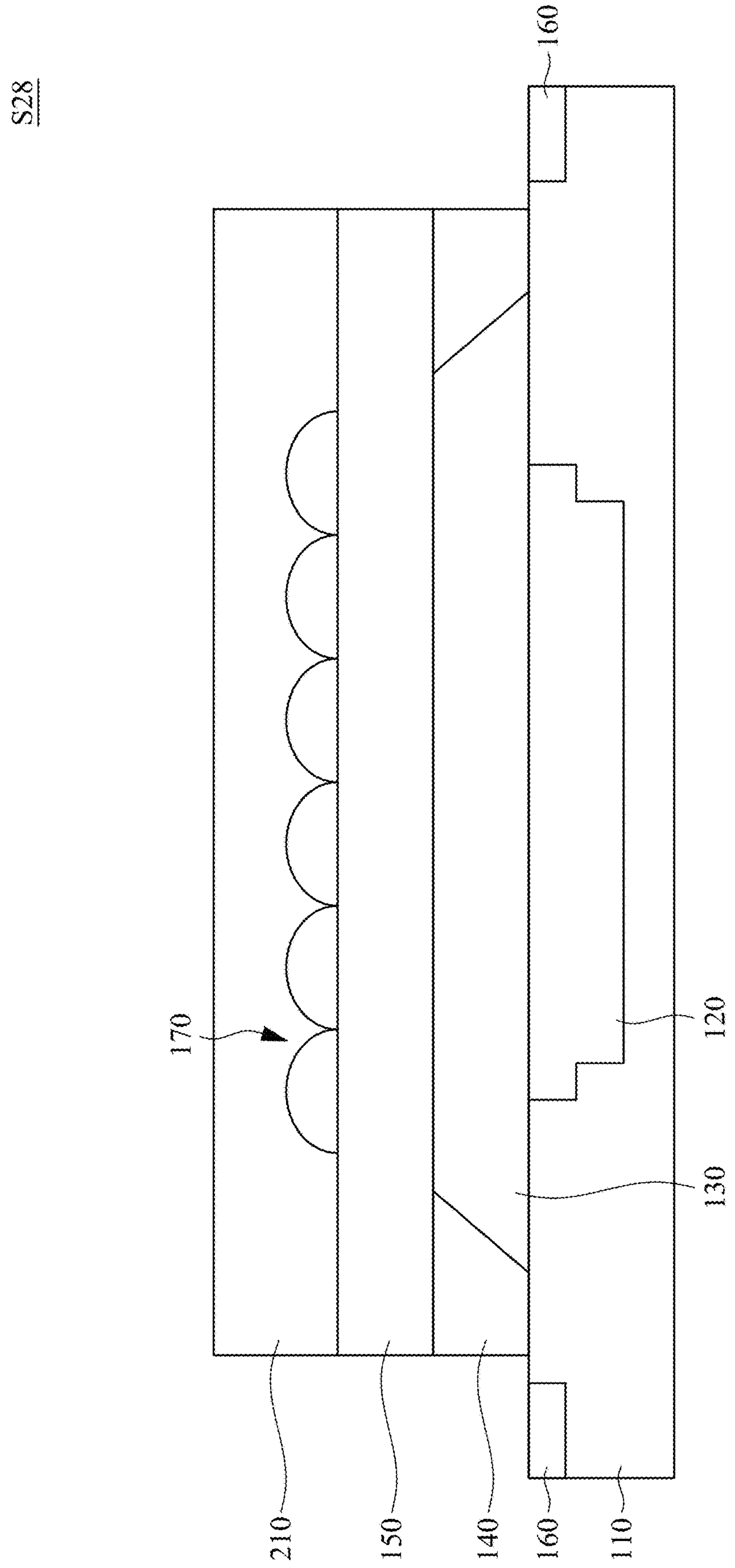

Referring to FIG. 12, the method of manufacturing the microelectronic device goes to step S28. An etching process is performed using the second photoresist layer 210 as the mask, such that the portions of the spacer layer 150 and the refill layer 140 unprotected by the second photoresist layer 210 are removed. The pads 160 are exposed at the semiconductor substrate 110.

Figure 13:
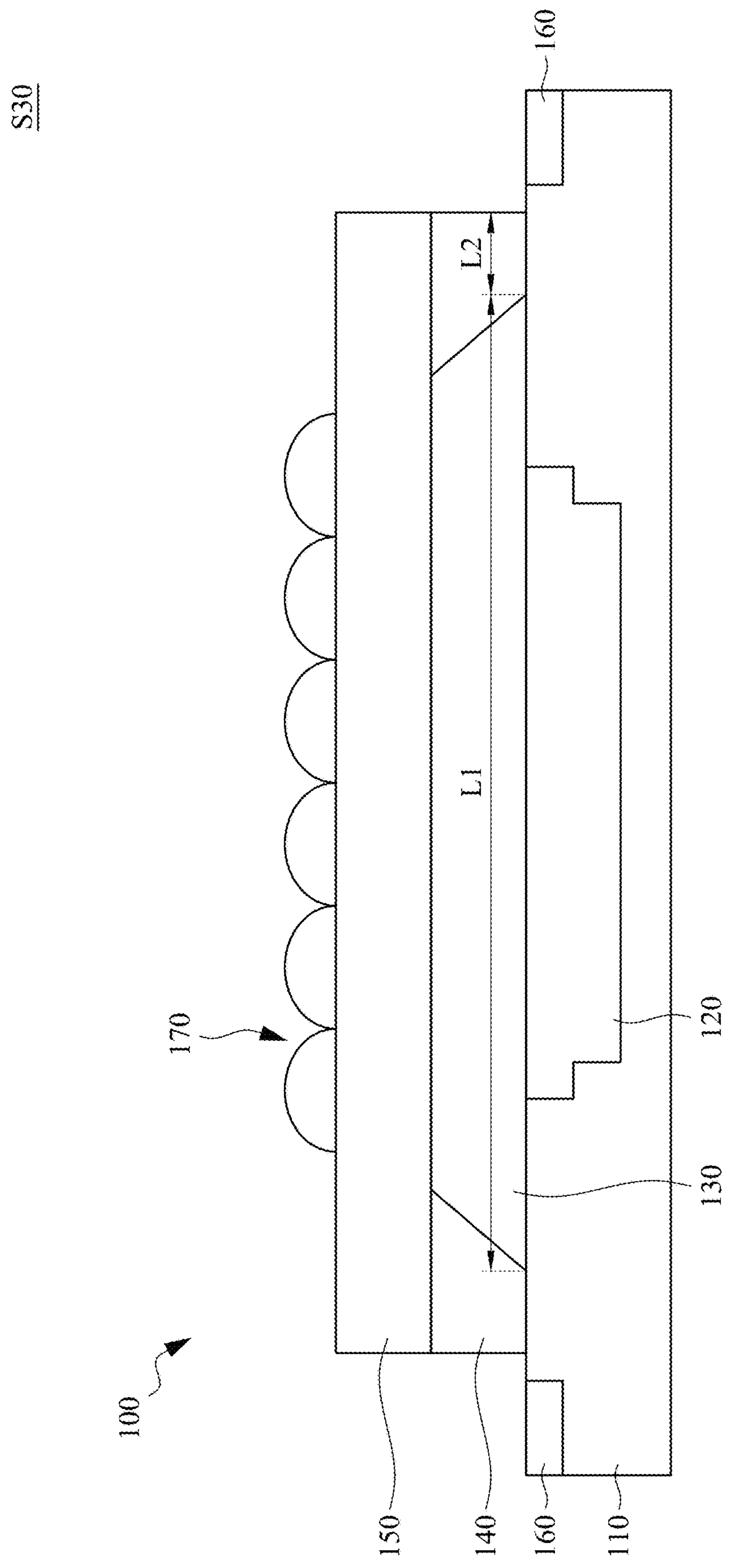

Referring to FIG. 13, the method of manufacturing the microelectronic device goes to step S30. The second photoresist layer 210 is removed, and the micro-lens layer 170 is revealed. The microelectronic device 100 corresponding to FIG. 1 is provided. The refill layer 140 and the spacer layer 150 of the microelectronic device 100 are organic layers such that the stress between the interface of the refill layer 140 and the spacer layer 150 can be reduced and more balance. The ratio of the second dimension L2 of the section of the refill layer 140 to the first dimension L1 of the multi-film stack 130 is in a range from 0.03 to 0.06, to provide better binding ability between the multi-film stack 130, the refill layer 140, and the spacer layer 150.

Figure 14:
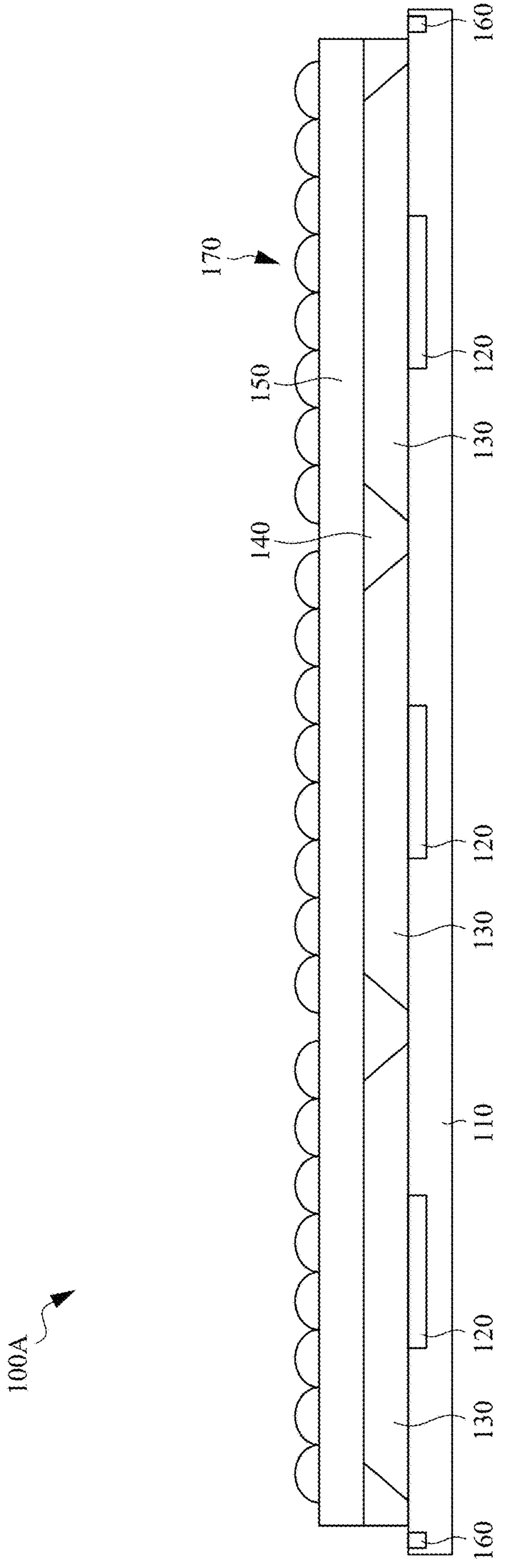
FIG. 14 to FIG. 16 are cross-sectional views of the microelectronic device according to different embodiments of the disclosure.
Figure 15:
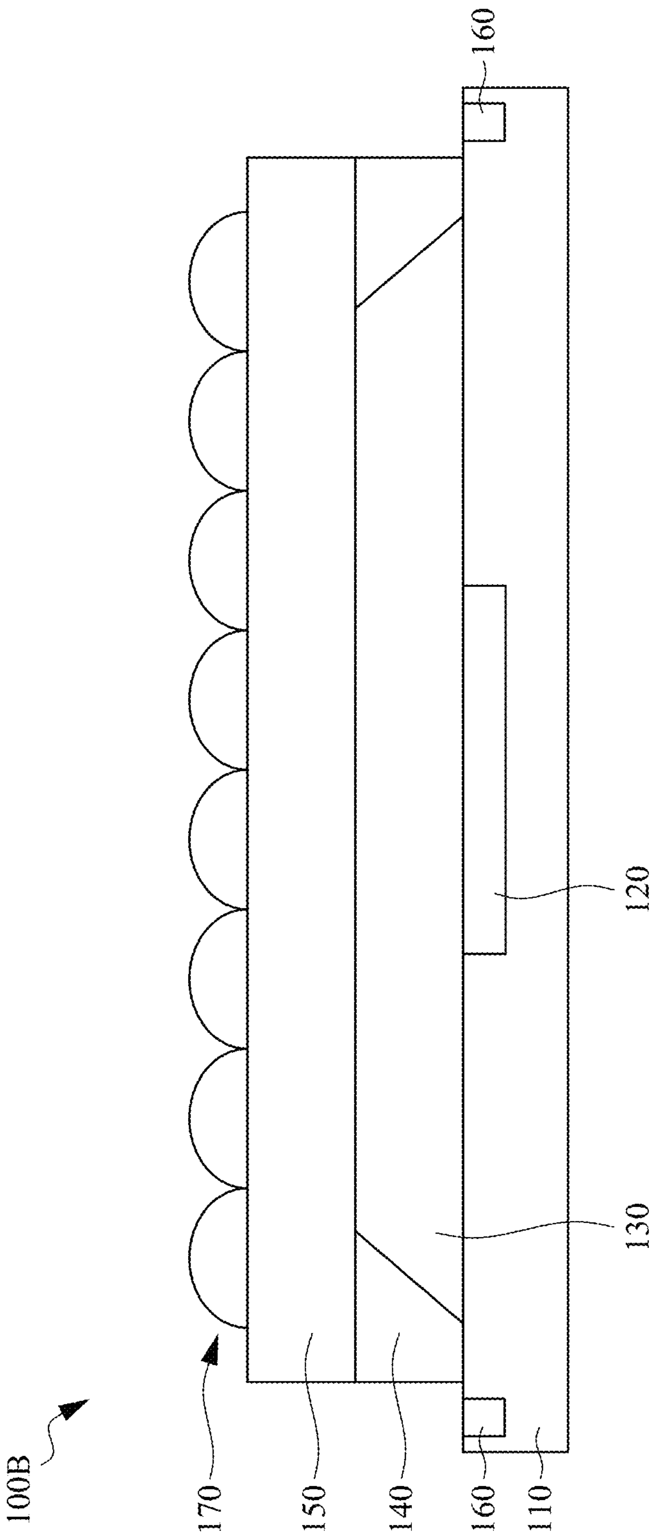
Figure 16:
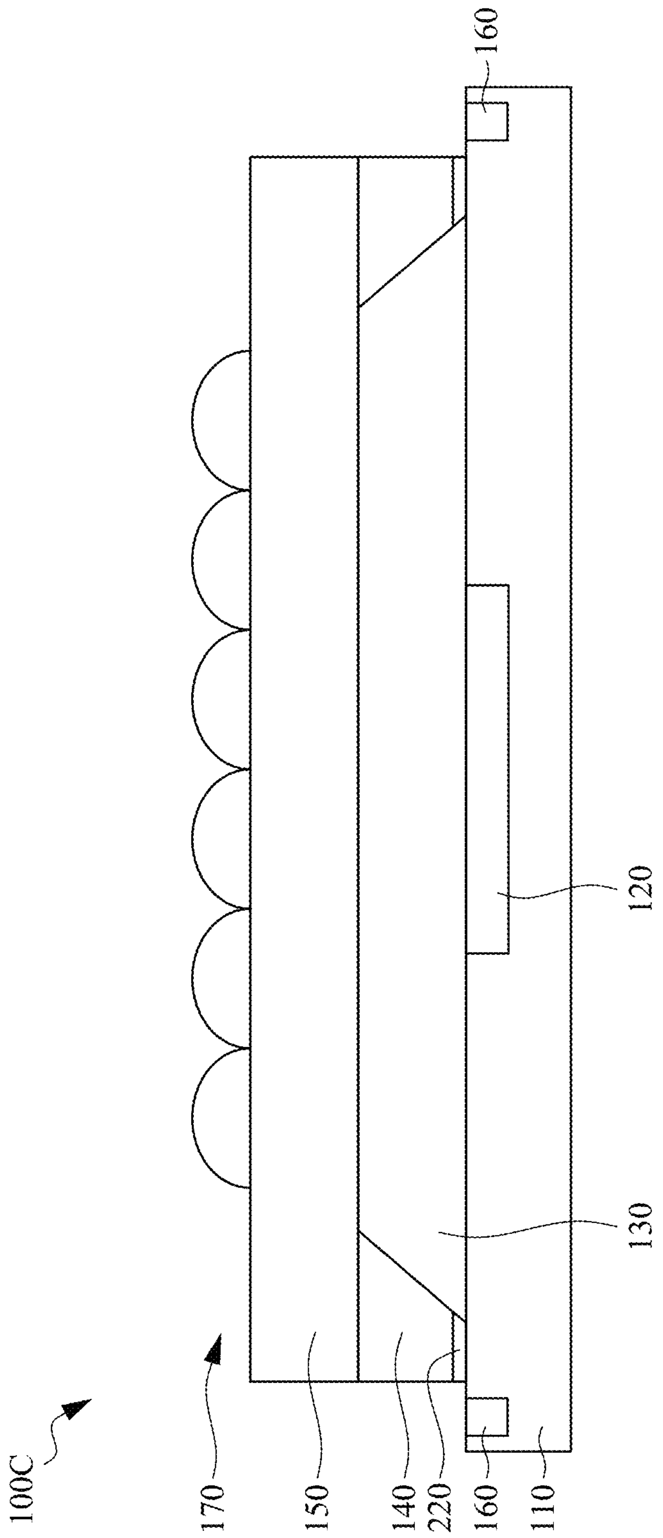

Reference is made to FIG. 14 to FIG. 16, which are cross-sectional views of the microelectronic device according to different embodiments of the disclosure. As shown in FIG. 14, the microelectronic device 100A includes a plurality of sensing elements 120 on the semiconductor substrate 110, and the number of the corresponding multi-film stacks 130 is plural. The refill layer 140 encircles the multi-film stacks 130, and the spacer layer 150 is disposed on the multi-film stacks 130 and the refill layer 140. The micro-lens layer 170 is disposed on the spacer layer 150, and the pads 160 are disposed at the peripheral area of the semiconductor substrate 110 and are not covered by the refill layer 140.

As shown in FIG. 15, the micro-lens layer 170 of the microelectronic device 100B is disposed on the spacer layer 150 and covers both the multi-film stacks 130 and the refill layer 140.

As shown in FIG. 16, the microelectronic device 100C further includes an adhesion layer 220 disposed between the refill layer 140 and the semiconductor substrate 110. The adhesion layer 220 can improve the bonding strength between the refill layer 140 and the semiconductor substrate 110 when the ratio of the dimension of the refill layer 140 to the multi-film stack 130 is limited.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A microelectronic device comprising:

a semiconductor substrate;

at least one sensing element disposed in the semiconductor substrate;

at least one multi-film stack disposed on the semiconductor substrate and covering the sensing element, wherein an area of a top surface of the multi-film stack is less than an area of a bottom surface of the multi-film stack;

a refill layer disposed on the semiconductor substrate and encircling the multi-film stack, wherein the multi-film stack has a first dimension measured in a direction, a section of the refill layer has a second dimension measured in the direction, and a ratio of the second dimension to the first dimension is in a range from 0.03 to 0.06; and a spacer layer disposed on the multi-film stack and the refill layer, wherein the refill layer and the spacer layer are organic layers.

2. The microelectronic device of claim 1, wherein the sensing element is a photodiode, and the multi-film stack is a waveband filter.

3. The microelectronic device of claim 1, wherein a thickness of the refill layer is in a range from 0.5 μm to 10 μm.

4. The microelectronic device of claim 1, wherein a ratio of the area of the top surface of the multi-film stack to an area of a top surface of the semiconductor substrate is less than 90%.

5. The microelectronic device of claim 1, wherein the second dimension is measured at a bottom surface of the section of the refill layer.

6. The microelectronic device of claim 1, wherein an area of a top surface of the refill layer is greater than an area of a bottom surface of the refill layer, a third dimension is measured at the top surface of the section of the refill layer, and a ratio of the third dimension to the first dimension is in a range from 0.035 to 0.065.

7. The microelectronic device of claim 1, wherein a thickness of the spacer layer is in a range from 0.5 μm to 300 μm.

8. The microelectronic device of claim 1, wherein the multi-film stack is an inorganic material, an elastic modulus of the multi-film stack is in a range from 60 GPa to 230 GPa.

9. The microelectronic device of claim 1, wherein an elastic modulus of the refill layer is in a range from 1 GPa to 45 GPa.

10. The microelectronic device of claim 1, wherein an elastic modulus of the spacer layer is in a range from 1 GPa to 45 GPa.

11. The microelectronic device of claim 1, wherein a coefficient of thermal expansion of the multi-film stack is less than 10 ppm.

12. The microelectronic device of claim 1, wherein a coefficient of thermal expansion of the refill layer is in a range from 250 ppm to 550 ppm.

13. The microelectronic device of claim 1, wherein a coefficient of thermal expansion of the spacer layer is 20 ppm to 330 ppm.

14. The microelectronic device of claim 1, wherein a material of the multi-film stack comprises dielectric, transparent conductive oxide, or metallic material.

15. The microelectronic device of claim 1, wherein the refill layer comprises at least one material selected from a group consisting of flourene oligomer, bisphenol A ethoxylate diacrylate, propylene glycol monomethyl ether, and propylene glycol monomethylether acetate.

16. The microelectronic device of claim 1, wherein the spacer layer comprises at least one material selected from a group consisting of flourene oligomer, bisphenol A ethoxylate diacrylate, propylene glycol monomethyl ether, and propylene glycol monomethylether acetate.

17. The microelectronic device of claim 1, wherein a number of the at least one sensing element is plural, a number of the at least one multi-film stack is plural, and the refill layer encircles the multi-film stacks.

18. The microelectronic device of claim 1, further comprising a micro-lens layer disposed on the spacer layer, wherein the micro-lens layer covers the multi-film stack.

19. The microelectronic device of claim 1, further comprising a micro-lens layer disposed on the spacer layer, wherein the micro-lens layer covers the multi-film stack and the refill layer.

20. The microelectronic device of claim 1, further comprising an adhesion layer disposed between the refill layer and the semiconductor substrate.

* * * * *